(12) United States Patent
Reeves et al.

(10) Patent No.: US 7,257,654 B1
(45) Date of Patent: Aug. 14, 2007

(54) PCI BRIDGE DEVICE CONFIGURED FOR USING JTAG SCAN FOR WRITING INTERNAL CONTROL REGISTERS AND OUTPUTTING DEBUG STATE

(75) Inventors: Richard W. Reeves, Westboro, MA (US); Austen John Hypher, Newton, MA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 235 days.

(21) Appl. No.: 10/983,646

(22) Filed: Nov. 9, 2004

(51) Int. Cl.
*G06F 13/30* (2006.01)
*G06F 13/36* (2006.01)

(52) U.S. Cl. .................. 710/104; 710/306; 700/26; 326/38

(58) Field of Classification Search ........... 710/104, 710/1, 200; 714/30, 45, 726, 727, 5, 6, 42, 714/43, 725; 326/38, 40, 82, 41, 16; 702/122; 365/191; 712/37; 717/128; 713/100, 189, 713/193, 194; 716/16, 17; 709/237; 380/28, 380/277
See application file for complete search history.

(56) References Cited

U.S. PATENT DOCUMENTS

| | | | |
|---|---|---|---|
| 5,282,271 A * | 1/1994 | Hsieh et al. ............... 326/38 |
| 5,343,478 A * | 8/1994 | James et al. ............... 714/726 |
| 5,428,800 A * | 6/1995 | Hsieh et al. ............... 326/82 |
| 6,044,025 A * | 3/2000 | Lawman ................... 365/191 |
| 6,125,463 A * | 9/2000 | Macchi .................... 714/726 |
| 6,145,100 A * | 11/2000 | Madduri ................... 714/45 |
| 6,185,732 B1 * | 2/2001 | Mann et al. ............... 717/128 |
| 6,262,596 B1 * | 7/2001 | Schultz et al. ............. 326/41 |
| 6,429,682 B1 * | 8/2002 | Schultz et al. ............. 326/41 |
| 6,567,932 B2 * | 5/2003 | Edwards et al. ............ 714/30 |
| 6,614,259 B2 * | 9/2003 | Couts-Martin et al. ....... 326/40 |
| 6,662,314 B1 * | 12/2003 | Iwata et al. ............... 714/42 |
| 6,748,456 B1 * | 6/2004 | Stanton et al. ............. 710/1 |
| 6,883,109 B2 * | 4/2005 | Erickson et al. ........... 714/5 |
| 6,918,027 B2 * | 7/2005 | Mantey et al. ............. 712/37 |
| 6,948,147 B1 * | 9/2005 | New et al. ................ 716/16 |
| 6,965,675 B1 * | 11/2005 | Trimberger et al. ......... 380/277 |

(Continued)

OTHER PUBLICATIONS

"IEEE Standard Test Access Port and Boundary-Scan Architecture", IEEE Std 1149-1-2001, Jul. 23, 2001, IEEE, New York.

(Continued)

*Primary Examiner*—Christopher E. Lee
(74) *Attorney, Agent, or Firm*—Manelli Denison & Selter PLLC (57) ABSTRACT

An integrated device (e.g., an integrated PCI bridge device), having configuration registers for storing configuration values, device logic for generating internal state values based on the configuration values, and a JTAG interface configured for receiving a serial input stream and outputting a serial output stream, further includes write logic and debug read logic. The write logic is configured for writing selected portions of the serial input stream into respective selected ones of the configuration registers, based on a detected input indicating a JTAG-based override. The debug read logic is configured, in response to a detected debug mode, for outputting selected internal state values for the serial output stream, based on selection values from the serial input stream and having been stored in a prescribed at least one of the selected configuration registers.

18 Claims, 9 Drawing Sheets

U.S. PATENT DOCUMENTS

| | | | |
|---|---|---|---|
| 6,973,588 B2 * | 12/2005 | DeMeo et al. | 714/6 |
| 6,981,153 B1 * | 12/2005 | Pang et al. | 713/194 |
| 6,983,441 B2 * | 1/2006 | Wescott | 716/17 |
| 7,000,161 B1 * | 2/2006 | Allen et al. | 714/725 |
| 7,007,099 B1 * | 2/2006 | Donati et al. | 709/237 |
| 7,017,081 B2 * | 3/2006 | Gomez | 714/30 |
| 7,047,467 B1 * | 5/2006 | Khu et al. | 714/727 |
| 7,058,177 B1 * | 6/2006 | Trimberger et al. | 380/28 |
| 7,058,856 B2 * | 6/2006 | Shinmori | 714/30 |
| 7,069,477 B2 * | 6/2006 | Bland et al. | 714/43 |
| 7,078,929 B1 * | 7/2006 | Draper et al. | 326/16 |
| 7,089,140 B1 * | 8/2006 | McKenzie et al. | 702/122 |
| 7,117,372 B1 * | 10/2006 | Trimberger et al. | 713/189 |
| 7,117,373 B1 * | 10/2006 | Trimberger et al. | 713/193 |
| 7,134,025 B1 * | 11/2006 | Trimberger | 713/189 |
| 7,162,644 B1 * | 1/2007 | Trimberger | 713/189 |
| 2004/0103341 A1 * | 5/2004 | DeMeo et al. | 714/6 |
| 2004/0133771 A1 * | 7/2004 | King et al. | 713/100 |
| 2004/0225783 A1 * | 11/2004 | Erickson et al. | 710/200 |

OTHER PUBLICATIONS

Patavalis, "A Brief Introduction to the JTAG Boundary Scan Interface", <http://www.inaccessnetworks.com/projects/ianjtag/jtag-intro/jtag-intro.html>, Nov. 8, 2001, pp. 1-5, Athens.

"AMD-8131™ HyperTransport™ PCI-X® Tunnel Data Sheet", 24637 Rev 3.02, Aug. 10, 2004.

* cited by examiner

| JTAG User Register Bits 80a | Addr. Offset, 88 | CSR Registers, 82 |
|---|---|---|
| 0-24 | 1x78 | Debug and PCI Phase Interpolator Control 82a |
| 25-40 | 1x7C | PCI Phase Interpolater Override Settings 82b |
| 41-60 | 1x98 | Compensation Settings 82c |
| 61-82 | 1x80 | Compensation Settings 82d |
| 83-90 | 1x84 | PCI Compensation Resistors Settings 82e |
| 91-112 | 1x88 | PCI Compensation Averager Settings 82f |
| 113-119 | 1x8C | Component Override Settings 82g |
| 120-127 | 1x90 | Compensation Settings 82h |
| 128-140 | 1x94 | Compensation Settings 82i |
| 141-154 | 1xB8 | Analog Debug Mux Control 82j |
| 155-183 | 1xBC | HyperTransport™ Phase Interpolator Control 82k |
| 184-215 | 1xC0 | Link PHY Compensation Control 82l |
| 216-247 | 1xC4 | Link PHY Compensation Control 82m |
| 248-279 | 1xC8 | Link PHY Compensation Control 82n |
| 280-296 | 1xCC 82o | Hypertransport™ Calibration Logic Controls |
| 297-305 | 1xD0 82p | Hypertransport™ Calibration Logic Controls |
| 306-336 | 1xD4 82q | Hypertransport™ Calibration Logic Controls |
| 337-364 | 1xD8 82r | Hypertransport™ Calibration Logic Controls |
| 365-392 | 1xDC 82s | Hypertransport™ Calibration Logic Controls |
| 393-414 | 1xE0 | Link PHY Compensation Control 82t |
| 415-418 | 84 | (Inputs to Logic for setting PCI Speed Mode) |
| 419 | 86 | (JTAG Override if=0) |

| JTAG User Register Bits | | Register Field 82a | | |
|---|---|---|---|---|
| 0-3 | " 7 " | 90a | PI Window | (Bits 0-3) |
| 4-7 | " 5 " | 90b | PILIM | (Bits 4-7) |
| 8-10 | " 6 " | 90c | PLLSYNC_CTL | (Bits 8-10) |
| 11-14 | " D " | 90d | DBGBotLo | (Bits 16-19) |
| 15-17 | " 6 " | 90e | DBGTopLo | (Bits 20-22) |
| 18-21 | " 3 " | 90f | DBGBotHi | (BIts 24-27) |
| 22-24 | " 1 " | 90g | DBGTopHi | (Bits 28-30) |

PCI BRIDGE DEVICE CONFIGURED FOR USING JTAG SCAN FOR WRITING INTERNAL CONTROL REGISTERS AND OUTPUTTING DEBUG STATE

BACKGROUND OF THE INVENTION

1. Field of the Invention

The present invention relates to integrated network devices having Peripheral Component Interconnect (PCI) bridges.

2. Background Art

Peripheral Component Interconnect (PCI) interfaces have been used to provide high-speed connectivity between devices in a multi-device system, such as a processor based system such as a personal computer.

Figure 1:
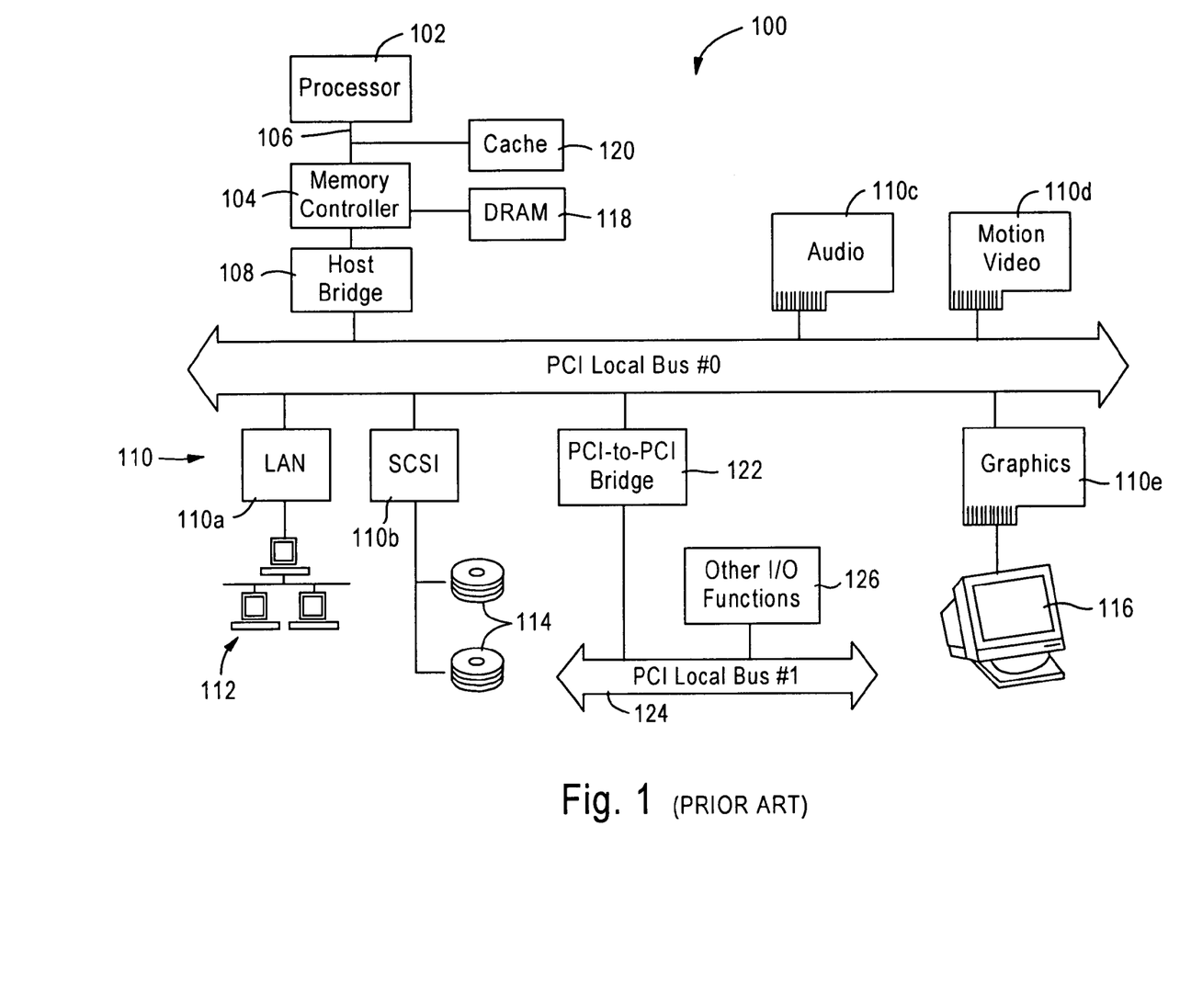
FIG. 1 is a block diagram of a conventional (PRIOR ART) implementation of a PCI based system.

FIG. 1 is a diagram illustrating a conventional implementation of a PCI bus system architecture 100. The system 100 includes a processor 102 coupled to a memory controller 104 via a local bus 106. The processor 102 and the memory controller 104 are coupled to a PCI local bus 106 (labeled PCI Local Bus #0) via a host bridge 108.

The host bridge 108 provides a low latency path through which the processor 102 may directly access PCI devices 110, for example a network interface card 111a providing access to a local area network, a disc drive (SCSI) controller 110b providing access to disk drives 114, an audio card 10c, a motion picture card 111d, or a graphics card 110e configured for driving a monitor 116. The host bridge 108 also provides a high bandwidth path allowing PCI masters on the PCI bus 106 direct access to the system memory 118 via the memory controller 104. A cache memory 120 is independent of the system memory 118 for use by the processor 102.

The term "host bridge" refers to the bridge device 108 that provides access to the system memory 118 for the devices 110 connected to the PCI bus 106. A PCI-to-PCI bridge 122 also may be used to connect a second PCI bus 124 to the PCI bus 106, the second PCI bus 124 configured for connecting other I/O devices 126.

Newer PCI bus protocols are being published, including PCI-X Mode 2, that provide enhanced PCI functionality. These newer PCI bus protocols include the PCI Local Bus Specification, Rev 2.3, the PCI-X Protocol Addendum to the PCI Local Bus Specification, Rev. 2.0a, and the PCI-to-PCI Bridge Architecture Specification, Rev 1.2.

A particular problem encountered during development of new devices involves providing sufficient functionality within the new devices for configuration and testing, thereof, without substantially increasing the cost, complexity, or size of the new device. In particular, there is a desirability to improve the ability of controlling (i.e., modifying) the default settings of internal control registers without increasing device cost or complexity.

One technique for modifying default settings involved bypassing initial default settings of internal control registers having been stored in the device within an internal read-only memory (ROM). In particular, the initial default settings are stored in the ROM internal to the device as part of the device manufacture: if the device is implemented as an ASIC, the initial default settings could be stored in the ROM by mask programming. The device also could include an external ROM interface that would enable connection of an external ROM that would include updated default settings that superseded the initial default settings stored internally; hence, on powerup the device could be reprogrammed by its scanning the updated default settings from the external ROM via the external ROM interface, effectively replacing the initial default settings.

Use of an external ROM interface, however, requires extra pins for the device; further, additional logic is needed to interface with the external ROM and read the updated default settings instead of the initial default settings stored in the internal ROM. Further, the necessity of an external ROM requires reserving valuable space on a circuit board, and provides substantial difficulties when attempting to retrofit an external ROM onto a circuit board manufactured according to surface mount technology.

Problems also have been encountered in attempts to debug a new integrated (i.e., single-chip) device. In particular, previous device designs have implemented "debug modes", where internal multiplexers and associated logic have been implemented within the new device to output internal state information onto at least selected portions of the PCI bus for analysis. In particular, a user would connect a logic analyzer to the associated pins of the PCI bus in order to capture the signal traces output by the associated pins during debug mode.

Use of a logic analyzer, however, creates difficulties in attempting to connect the logic analyzer to the relevant device pins; further, use of a logic analyzer while the device is in debug mode requires configuring the device to output a given internal state, capturing the signal traces from the PCI bus, and then later retrieving and reviewing the stored signal traces in an attempt to reconstruct the internal state: such a tedious process may be impractical in certain situations, for example when attempting troubleshooting at a customer site.

The Joint Test Action Group (JTAG) published IEEE 1149.x, "IEEE Standard Test Access Port and Boundary-Scan Architecture" (referred to herein as the "JTAG Specification"). The JTAG features normally have been used to facilitate production testing of printed circuit boards. In particular, the JTAG Specification defines test logic that can be included in an integrated circuit to provide standardized approaches for testing interconnections between integrated circuits mounted on a printed circuit board. The JTAG Specification overcomes difficulties in testing printed circuit boards implemented based on surface mount interconnection technology by defining a framework for conveying test data to or from the boundaries of individual components so that they can be tested as if they were freestanding.

Hence, a "boundary scan interface" has boundary-scan register cells connected to pins of a component to form a shift register chain around the border of the design of the component. Hence, the JTAG Specification allows interconnections between components to be tested without the necessity of a complex "bed-of-nails" type testing system. Further, the JTAG Specification allows components on the board to be tested by isolating on-chip system logic from external stimuli from surrounding components while performing an internal self-test of the on-chip system logic; alternatively, a static test of the on-chip system logic can be implemented by supplying test data to the component via the JTAG interface, and examining the test results output via the JTAG interface.

SUMMARY OF THE INVENTION

There is a need for an arrangement that enables an integrated (i.e., single-chip) device, for example an integrated PCI bridge device, to be programmable via an external interface, while minimizing unnecessary hardware such as device pins, logic, etc.

There also is a need for an arrangement that enables capture of internal state data from an integrated (i.e., single-chip) device, for example an integrated PCI bridge device, without the need for a logic analyzer.

These and other needs are attained by the present invention, where an integrated device (e.g., an integrated PCI bridge device), having configuration registers for storing configuration values, device logic for generating internal state values based on the configuration values, and a JTAG interface configured for receiving a serial input stream and outputting a serial output stream, further includes write logic and debug read logic. The write logic is configured for writing selected portions of the serial input stream into respective selected ones of the configuration registers, based on a detected input indicating a JTAG-based override. The debug read logic is configured, in response to a detected debug mode, for outputting selected internal state values for the serial output stream, based on selection values from the serial input stream and having been stored in a prescribed at least one of the selected configuration registers.

Hence, the integrated PCI bridge device is able to overwrite existing default configuration values via a JTAG interface, eliminating the necessity of an external ROM interface and associated logic. Further, the integrated PCI bridge device enables internal state values to be retrieved via the JTAG interface, eliminating the necessity of a logic analyzer and enabling retrieval and evaluation aof the internal state values using a software-based program executable by a computer.

One aspect of the present invention provides a method in an integrated device having a JTAG interface. The method includes detecting by the integrated device a prescribed device input for a JTAG-based override, and receiving by the JTAG interface of the integrated device a JTAG clock and a serial input stream according to the JTAG clock. The method also includes detecting within the serial input stream a prescribed instruction for writing of configuration values into respective prescribed selected configuration registers. The method also includes selectively writing, based on detecting the prescribed device input and the prescribed instruction, the configuration values from within the serial input stream into the respective prescribed selected configuration registers of the integrated device.

Another aspect of the present invention provides an integrated device comprising configuration registers, a JTAG interface, and write logic. The configuration registers are configured for storing respective configuration values, and the JTAG interface configured for receiving a JTAG clock and a serial input stream according to the JTAG clock. The write logic is configured for detecting within the serial input stream a prescribed instruction for writing of configuration values into respective prescribed selected configuration registers. The write, logic also is configured for selectively writing, based on the prescribed instruction and detection of a prescribed device input specifying a JTAG-based override, selected portions of the serial input stream into the respective selected ones of the configuration registers as the prescribed selected configuration registers.

Additional advantages and novel features of the invention will be set forth in part in the description which follows and in part will become apparent to those skilled in the art upon examination of the following or may be learned by practice of the invention. The advantages of the present invention may be realized and attained by means of instrumentalities and combinations particularly pointed in the appended claims.

BRIEF DESCRIPTION OF THE DRAWINGS

Reference is made to the attached drawings, wherein elements having the same reference numeral designations represent like element elements throughout and wherein.

BEST MODE FOR CARRYING OUT THE INVENTION

The disclosed embodiment of the arrangement for using a JTAG interface for writing configuration data, and outputting internal state values, will be described in detail following an overview of the architecture of the HyperTransport™ tunnel/PCI-X bridge.

Architecture Overview

Figure 2:
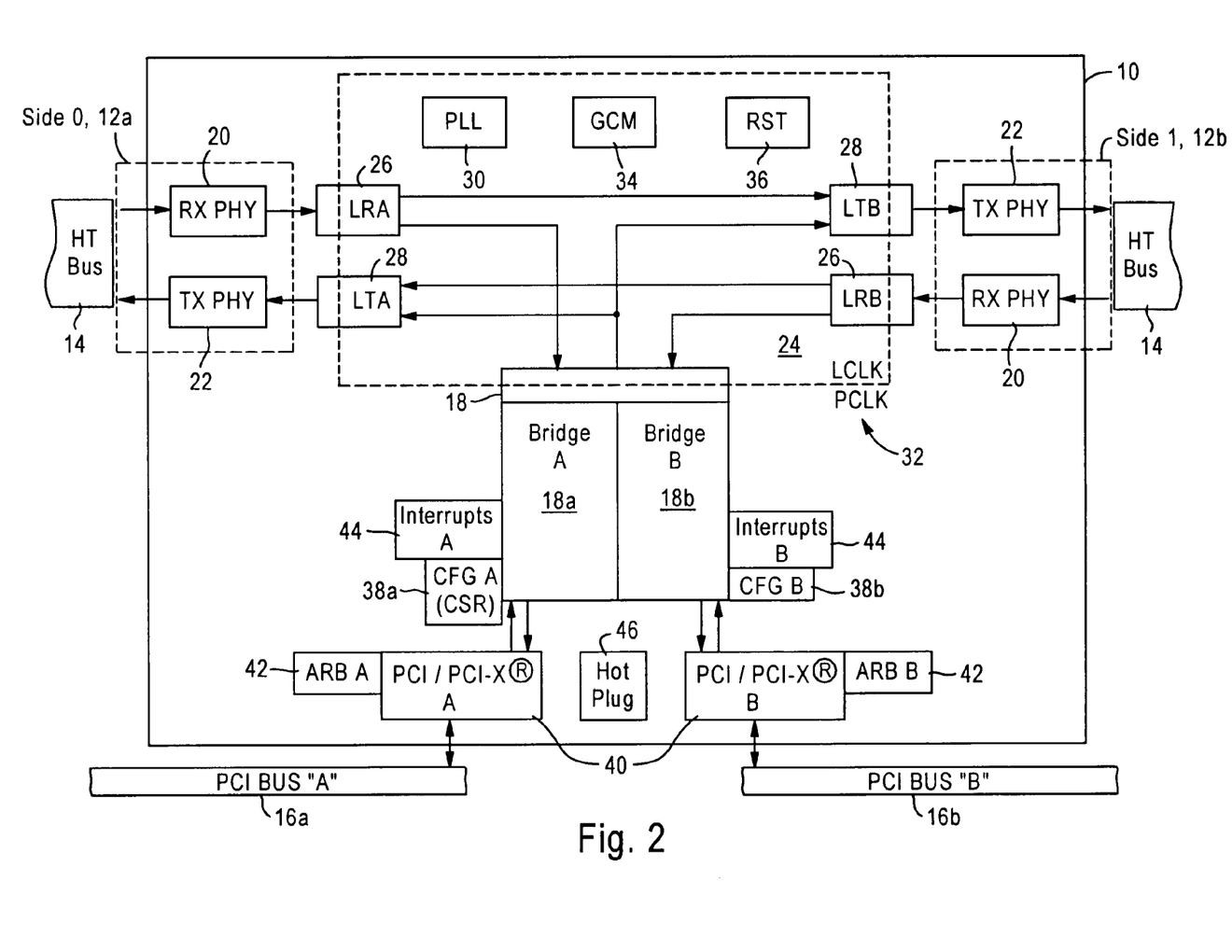
FIG. 2 is a diagram of a PCI host bridge device according to an embodiment of the present invention.

FIG. 2 is a diagram illustrating the transport tunnel-to-PCI host bridge device 10, according to an embodiment of the present invention. The transport tunnel-to-PCI host bridge device 10, preferably implemented as an integrated circuit on a single chip, is configured for operating as a Hyper-Transport™ (HT) tunnel device according to the Hyper-Transport™ IO Link Specification, Rev. 2.0, including errata up to specification Rev. 1.05c.

The transport tunnel-to-PCI host bridge device 10 includes two HT interfaces 12a and 12b labeled "Side 0" and "Side 1", respectively. HT packets received by a given interface (e.g., 12a) from an HT bus 14 can be passed through the device 10 to the other interface (e.g., 12b) (i.e., tunneled), enabling multiple HT tunnel devices to be connected serially (e.g., a daisy-chain arrangement) to form an HT chain on the bus 14 for transfer of HT packets.

The following nomenclature may assist in describing connections in serially connected HT tunnel devices. The HT interface (e.g., 12a) that is connected to (or toward) a HyperTransport™ host device (e.g., a host memory controller) is referred to as the "upstream" interface, and the other HT interface (e.g., 12b) is referred to as the "downstream" interface: if the upstream interface (e.g., 12a) is directly connected to the HyperTransport™ host device via the corresponding connected HT tunnel 14, then that tunnel connecting the upstream interface to the HyperTransport™ host device is referred to as the "upstream link"; if the upstream interface (e.g., 12a) is connected to a second HT device via an HT tunnel, where the second HT device provides a connection to (or toward) the HyperTransport™ host device, then that HT tunnel connecting the upstream interface and the second HT device is referred to as the "upstream tunnel". Note that the downstream interface may or may not be connected to another HT device or chain of devices.

The transport tunnel-to-PCI host bridge device 10 also provides bridging operations between the HT bus 14 and PCI buses 16*a* and/or 16*b*. In particular, the transport tunnel-to-PCI host bridge device 10 contains two independent HT-to-PCI-X bridges 18*a* and 18*b* in accordance with the HyperTransport™ Link Specification, Rev. 2.0, the PCI Local Bus Specification, Rev 2.3, the PCI-X Protocol Addendum to the PCI Local Bus Specification, Rev. 2.0a, and the PCI-to-PCI Bridge Architecture Specification, Rev 1.2. The transport tunnel-to-PCI host bridge device 10 includes configurable registers (38*a*, 38*b*) that identify the address ranges utilized by each of the PCI bus 16*a*, the PCI bus 16*b*, and the HT bus 14.

Also note that the device 10 may identify a destination for a received HT packet based on a device identifier and bus identifier specified in the HT packet; alternately the device 10 may be configured to identify a destination bridge (e.g., 18*a*, 18*b*) based on a corresponding unit identifier (e.g., 181, 182) according to HyperTransport™ protocol. In addition, the transport tunnel-to-PCI host bridge device 10 includes configuration (CFG) registers 38*a*, 38*b*: the configuration register 38*a* includes command and status registers (CSRs) within prescribed address spaces used by the transport tunnel-to-PCI host bridge device 10 for internal configuration, in accordance with the above-described PCI and HyperTransport™ specifications. Hence, the transport tunnel-to-PCI host bridge device 10 can store configuration information to an addressable CSR based on identifying an HT packet specifying a device identifier for the device 10.

Hence, the transport tunnel-to-PCI host bridge device 10 can either tunnel HT packets received from the HT bus 14 by passing the packets from one interface (e.g., 12*a*) to the other interface (e.g., 12*b*), or the transport tunnel-to-PCI host bridge device 10 can pass the HT packets to one of the PCI buses 16*a* or 16*b* via the corresponding bridge 18*a* or 18*b*. Also note that the transport tunnel-to-PCI host bridge device 10 can process and respond to a received HT packet that is destined for the transport tunnel-to-PCI host bridge device 10 (e.g., for storage of configuration data).

The bridges 18*a* and 18*b* of the transport tunnel-to-PCI host bridge device 10 also forward onto the HT bus 14 any data having been received from the respective PCI buses 16*a* or 16*b* that specify a destination address within the prescribed address range specified within the CSRs for the HT bus 14.

Each of the HT interfaces 12*a* and 12*b* includes a receive physical layer transceiver (RX PHY) 20 and a transmit physical layer transceiver (TX PHY) 22. Each of the PHYs 20 and 22 include synchronization First-in-First-out (FIFO) registers for buffering packets according to a prescribed HT clock domain, and compensation circuitry to ensure electrical compliance with the HyperTransport™ specification. In particular, the RX PHY receives a packet and a clock associated with the packet according to the HT clock domain on the bus 14; the FIFO registers in the PHYs 20 and 22 are used to transition between the HT clock domain and a local clock (LCLK) domain 24.

The device 10 includes a local clock (LCLK) domain 24 that relies on a clock that is independent of any variations in clocks driven by the HT bus 14. The device 10 includes, within the local clock domain 24, receive logic 26 and transmit logic 28 for each of the HT interfaces 12 and 12*b*. The device also includes a phase locked loop (PLL) circuit 30 configured for generating the local clock (LCLK) and a phase-controlled clock (PCLK) 32, and maintaining synchronization of those clocks as needed.

The receive logic 26 is configured for determining whether a received HT packet from the HT bus 14 should be forwarded to the corresponding transmit logic 28 for tunneling of the HT packet, whether the received HT packet should be forwarded to the bridge 18 for internal configuration of the device 10, or forwarded to the bridge 18 for transfer of the received HT packet onto a determined one of the PCI buses 16*a* or 16*b*.

The device 10 also includes within the local clock domain a link interface cycle manager (GCM) 34. The GCM 34 is configured for arbitrating the order of transactions that are to occur within the local clock domain 24. For example, the GCM 34 may arbitrate between transactions that are to be output by the transmit logic (LTA) 28. The reset logic (RST) 36 is configured for managing reset and device initialization operations, including implementing test and diagnostic modes.

The HT-to-PCI bridge 18 is configured for transferring HT packets, forwarded from the HT bus 14 by one of the receive logic blocks (e.g., LRA or LRB) 26, to one of the PCI buses 16*a* or 16*b*. In particular, the receive logic block 26 having received the HT packet will specify to the bridge 18 the PCI bus (e.g., 16*a*) on which the HT packet is to be output. The HT-to-PCI bridge 18 also is configured for transferring packets from one of the PCI buses 16*a* or 16*b* to one of the transmit logic blocks (e.g., LTA or LTB) 28 for output onto the HT bus 14. The bridge 18 (e.g., the bridge 18*a*) identifies the destination address of the HT packet as falling within the address range of either the PCI bus (e.g., 16*a*) or the configuration space of the configuration register (e.g., 38*a*), and forwards the packet accordingly.

The device 10 also includes, for each PCI bus (e.g., 16*a*, 16*b*), a bridge 18*a* and 18*b*, the configuration registers 38*a* and 38*b*, a PCI interface module 40, a PCI arbitration module 42, and an interrupt controller 44. The device 10 also includes a hot plug module 46. The configuration registers 38*a* and 38*b* include registers, addressable via the HT bus 14, for configuration of the respective components associated with bus operations for the respective PCI buses 16*a* and 16*b*. Each PCI interface module 40 is configured for transmitting and receiving PCI data bursts according to the above-identified PCI specifications. Each PCI arbitration module 42 is configured for managing PCI bus arbitrations for the corresponding attached PCI bus (e.g., 16*a* or 16*b*), including identifying a bus master for PCI bus transactions. Each interrupt controller 44 is configured for servicing interrupts detected on the corresponding PCI bus (e.g., 16*a* or 16*b*), as well as software-based interrupts generated according to prescribed I/O Advanced Programmable Interrupt Controller (IOAPIC) specifications. Hence, various interrupt methods may be implemented in the interrupt controllers 44.

The hot plug module 46 is configured for managing hot plug operations based on prescribed configuration registers in the registers 38*a* and/or 38*b*, where a selected PCI slot or device can be powered down while the device 10, as well as other PCI devices on the PCI bus, remain in a powered state. For example, the hot plug module 46 may include logic that is compliant with the Standard Hot Plug Circuitry (SHPC) specified in the above-described PCI specifications; alternative implementations also may be included in the hot plug module 46, for example logic configured for interfacing with commercially-available power controllers, including the TPS2340A or the TPS2342 power controllers commercially available from Texas Instruments, Inc.

Writing Configuration Data and Outputting Debug State via JTAG Interface

Figure 3:
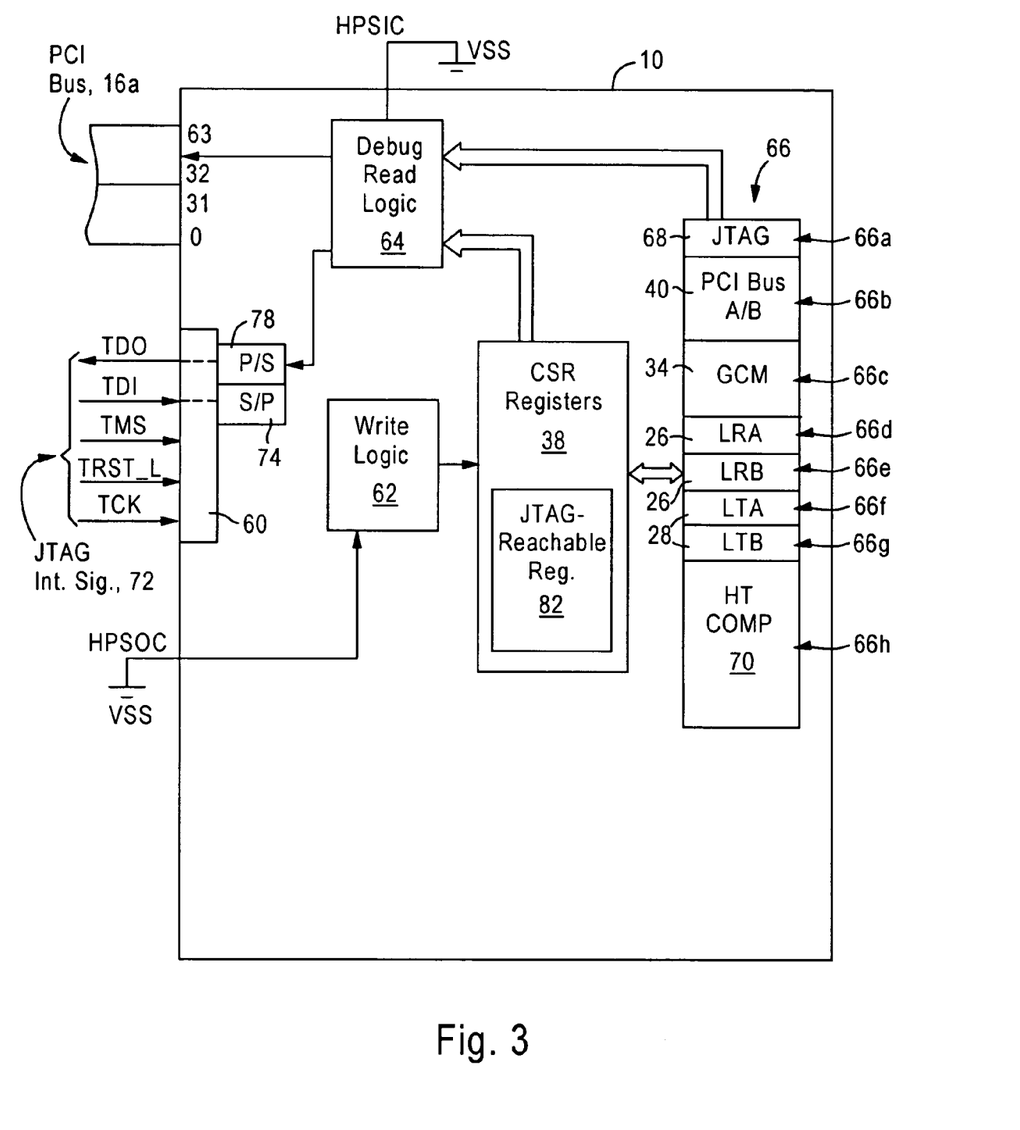
FIG. 3 is a second diagram of the PCI host bridge device of FIG. 2, illustrating write logic and debug read logic for storage and retrieval of data via a JTAG interface, according to an embodiment of the present invention.

FIG. 3 is a diagram illustrating in further detail the host bridge device 10, according to an embodiment of the present invention. In particular, FIG. 3 illustrates that the PCI host bridge device 10 includes a JTAG interface 60, write logic 62, debug read logic 64, and device logic 66. The device logic 66 implements the functions illustrated above with respect to FIG. 2, and includes, for example, the logic modules associated with the PCI bus modules 40, the GCM 34, the LRA and LRB 26, the LTA and LTB 2. The device logic 66 also includes JTAG logic module 68 and a HyperTransport™ compensation module 70. The JTAG module 68 is configured for implementing JTAG instructions, including JTAG instructions as specified in the JTAG Specification (e.g., the mandatory JTAG instructions of BYPASS, EXTEST, IDCODE, and BYPASS).

As described below, the disclosed embodiment also uses a user-defined register which allows JTAG control of a prescribed group 82 of CSR registers from among the available CSR registers 38, for example compensation values and PLL settings that enables compensation for the PCI bus 16, HyperTransport™ compensation, PLL settings, and debug settings.

As illustrated in FIG. 3, the JTAG interface 60 is configured for interfacing with JTAG interface signals 72 in accordance with the JTAG Specification. In particular, the JTAG interface 60 is configured for receiving a JTAG data input signal (TDI), a JTAG test mode select signal (TMS), a JTAG reset signal (TRST_L), and a JTAG test clock (TCK). In particular, the JTAG interface 60 is configured for receiving the serial input stream (TDI) according to the JTAG clock. In compliance with the JTAG Specification, the JTAG interface 60 latches the serial input stream (TDI) into a serial to parallel converter 74 that includes a latch for storing the JTAG scan chain received from the TDI input. The JTAG interface 60 also is configured for outputting the JTAG test data output signal (TDO).

As described below, the write logic 62 is configured for writing selected portions of the serial input stream into respective prescribed configuration registers 82 within the CSR register space 38 as configuration values. In particular, the JTAG interface 60 includes a user-defined instruction register (not shown) and is configured for detecting within the serial input stream a prescribed instruction (UserRegA/B) for writing of configuration values, supplied by the serial input stream, into respective prescribed configuration registers 82 within the CSR registers space 38.

The write logic 62 is configured for selectively writing, based on the prescribed instruction (UserRegA/B) and concurrent detection of a prescribed device input (HPSOC=VSS (logical 0)) that specifies a JTAG-based override.

Hence, the JTAG interface 60 can be used to write configuration data into internal configuration registers 82 that normally would be accessible only by a CPU interface such as the host HyperTransport™ link 14.

The device 10 also includes debug read logic 64 configured for reading a prescribed configuration register from the CSR registers 38 for debug selection control data, described below. Based on reading the debug selection control data, the debug read logic 64 outputs selected internal state values from the device logic 66 for output by the JTAG interface 60 as a serial output stream (TDO) according to the JTAG clock (TCK). Note, however, that the debug read logic does not necessarily have access to the entire register space of the registers 82 writable by the write logic, or the CSR register space 38, but preferably only the prescribed configuration register that provides debug selection control data (e.g., only from register fields 90d, 90e, 90f, and 90g of FIG. 5, described below).

As illustrated in FIG. 3, the device 10 includes a parallel to serial converter 78 configured for outputting the debug selection control data from the debug read logic 64 as the serial output stream (TDO) according to the JTAG clock (TCK).

Figure 4:
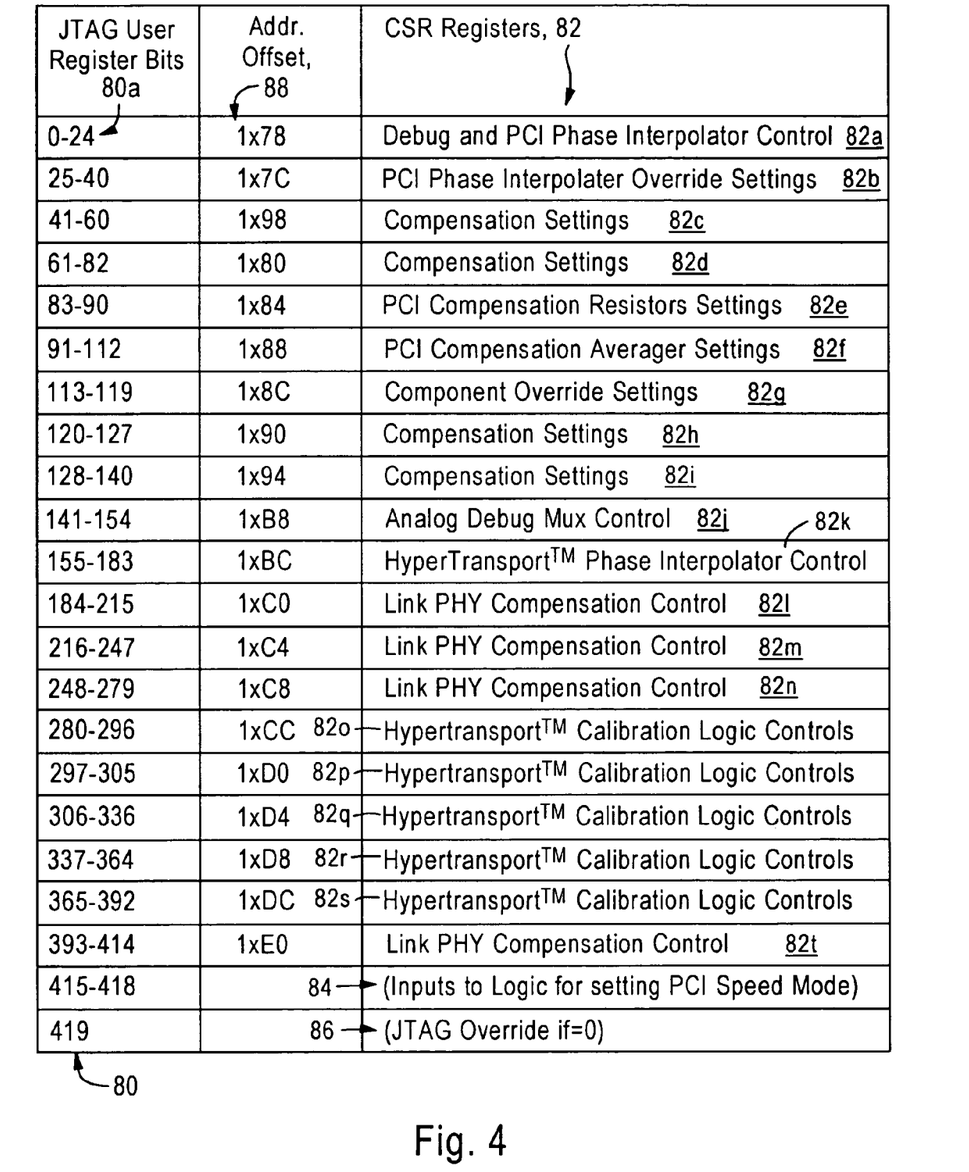
FIG. 4 is a diagram illustrating the portions of a serial data stream of a JTAG scan chain supplied to respective registers according to a prescribed register sequence, according to an embodiment of the present invention.

FIG. 4 is a diagram illustrating the mapping of selected portions of the serial input stream 80 to selected CSR registers 82 and logic inputs 84, 86, at respective memory locations, according to an embodiment of the present invention. In particular, the serial to parallel converter 74 includes a 420-bit latch configured for storing the 420-bit JTAG scan chain 80. The write logic 62, in response to detecting that the last bit (bit 419) is set to zero, begins mapping prescribed portions of the JTAG scan chain 80 to respective registers. For example, the first group 80a of bits (0-24) are mapped to a "Debug and PCI Phase Interpolator Control" register 82a having a register address location 88 at the hexadecimal address value "1×78" within the address space of the CSR registers 38. As apparent from FIGS. 3 and 4, the CSR registers 82 accessible via the JTAG interface 60 are a subset of the CSR register space 38.

Hence, the write logic 62 writes the register bits from the JTAG scan chain 80 into selected portions of prescribed registers 82 according to a prescribed sequence, where bits 0-24 of the JTAG scan chain 80 are mapped to register 82a, bits 2540 of the JTAG scan chain 80 are mapped to register 82b, bits 41-60 of the JTAG scan chain 80 are mapped to register 82c, etc., ending with bits 393-414 being mapped by the write logic 62 to the register 82t.

In addition, FIG. 4 illustrates that bits 415-418 of the JTAG scan chain 80 are supplied as inputs 84 to the PCI bus module 40 of the internal logic 66 for setting the PCI speed mode. Finally, as described above, bit 419 of the JTAG scan chain 80 is used as an instruction bit 86 to identify whether JTAG override is to be performed; as described above, if the bit 419 is set to "0", then the write logic 62 performs the JTAG override of the CSR registers 82 as described herein. If the write logic 62 determines that the bit 419 of the JTAG scan chain 80 is set to "1", then the JTAG override operation is disabled, resulting in no change in the CSR registers 82.

Figure 5:
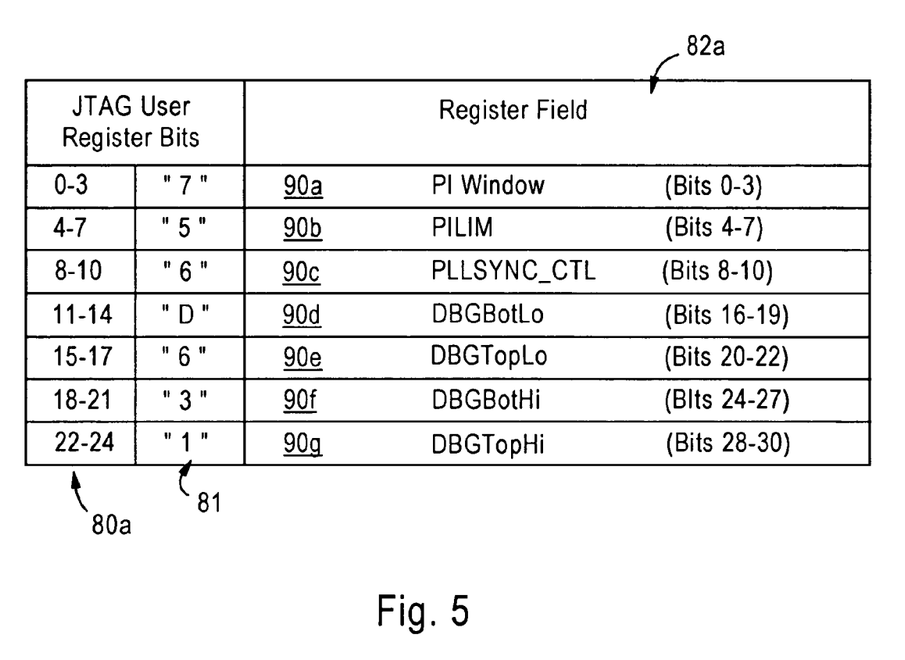
FIG. 5 is a diagram illustrating in further detail the supply of portions of the serial data stream, associated with a prescribed register, to prescribed portions of the register by the write logic of FIG. 3, according to an embodiment of the present invention.

FIG. 5 is a diagram illustrating in further detail the writing of JTAG user register bits 0-24 80a of the JTAG scan chain 80 as configuration values 81 into prescribed register fields 90 of the 32-bit Debug and PCI Phase Interpolator Control Register 82a by the write logic 62, according to an embodiment of the present invention. In particular, the write logic 62 includes internal mapping information as illustrated in FIGS. 4 and 5 that enables the write logic 62 to write the hexadecimal configuration values "7", "5", "6", "D", "6", "3", and "1" specified in respective bits 0-3, 4-7, 8-10, 11-14, 15-17, 18-21, and 22-24 of the selected bits 80a into respective prescribed register fields 90a, 90b, 90c, 90d, 90e, 90f, and 90g of the register 82a.

For example, the register field 90a is configured for storing the number of PCI clock cycles over which the external PCI clock is sampled and averaged (bits 0-3 of the register 82a); the register field 90b is configured for storing at bits 4-7 of the register 82a the tolerance of sampled values per sample window that the PCI phase interpolator will allow before adjusting the phase pointer; the register field 90c is configured for storing at bits 8-10 of the register 82a a field which indicates when various clocks are in phase. The register fields 90d, 90e, 90f, and 90g are used to specify MUX selection values for the debug read logic 64, described in detail below with respect to FIG. 9.

Figure 6:
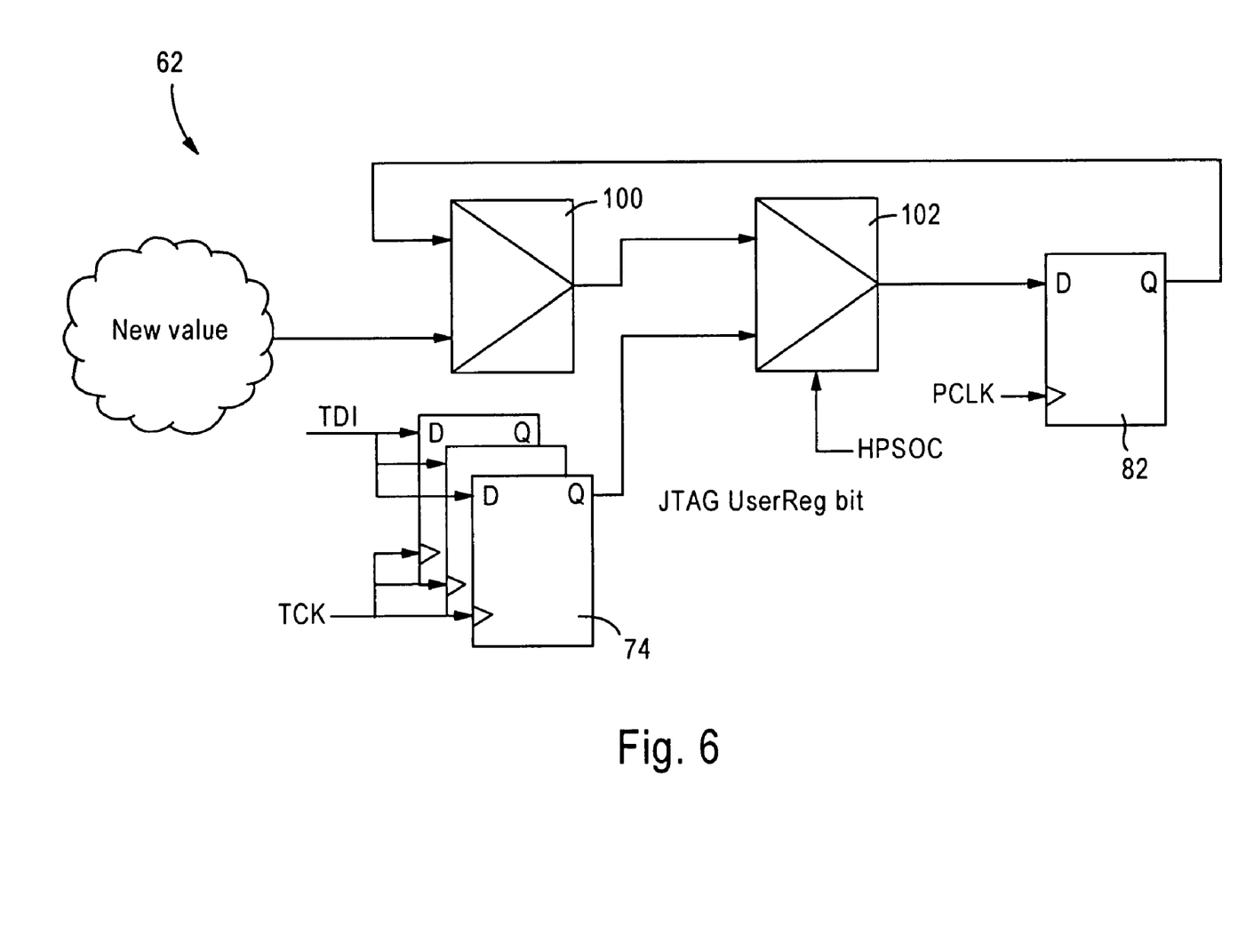
FIG. 6 is a diagram illustrating in further detail the write logic of FIG. 3.

FIG. 6 is a diagram illustrating in further detail the write logic 62, according to an embodiment of the present invention. The write logic 62 includes, for each bit of the JTAG scan chain 80, a first multiplexer 100 and a second multiplexer 102. The first multiplexer 100 is configured for selecting between the stored value in the register 82, and a new value supplied, for example, via a host HyperTransport™ link. Although not shown in FIG. 6, the multiplexer 100 is configured for outputting the same value that is stored in the register 82 unless a HyperTransport™ link-based override is in effect.

The write logic 62 also includes a second multiplexer 102 configured for selecting between the output of the multiplexer 100 and the bits of the JTAG scan chain 80 in response to a selection, for example the HPSOC signal illustrated in FIG. 3. The multiplexer 102 outputs either the stored value (if HPSOC equals "1") or the bit from the JTAG user scan chain 80 (if HPSOC equals "0") to the register 82.

Hence, the serial to parallel converter 74 is configured for latching the serial data (TDI) according to the JTAG clock (TCK), while the register 82 is configured for latching the supplied data according to an internal clock (PCLK). Hence, the write logic 62 ensures that the JTAG scan chain 80 supplied by the serial data stream (TDI) according to the JTAG clock (TCK) can be stored in the appropriate register 82 according to the internal clock domain (PCLK).

Figure 7:
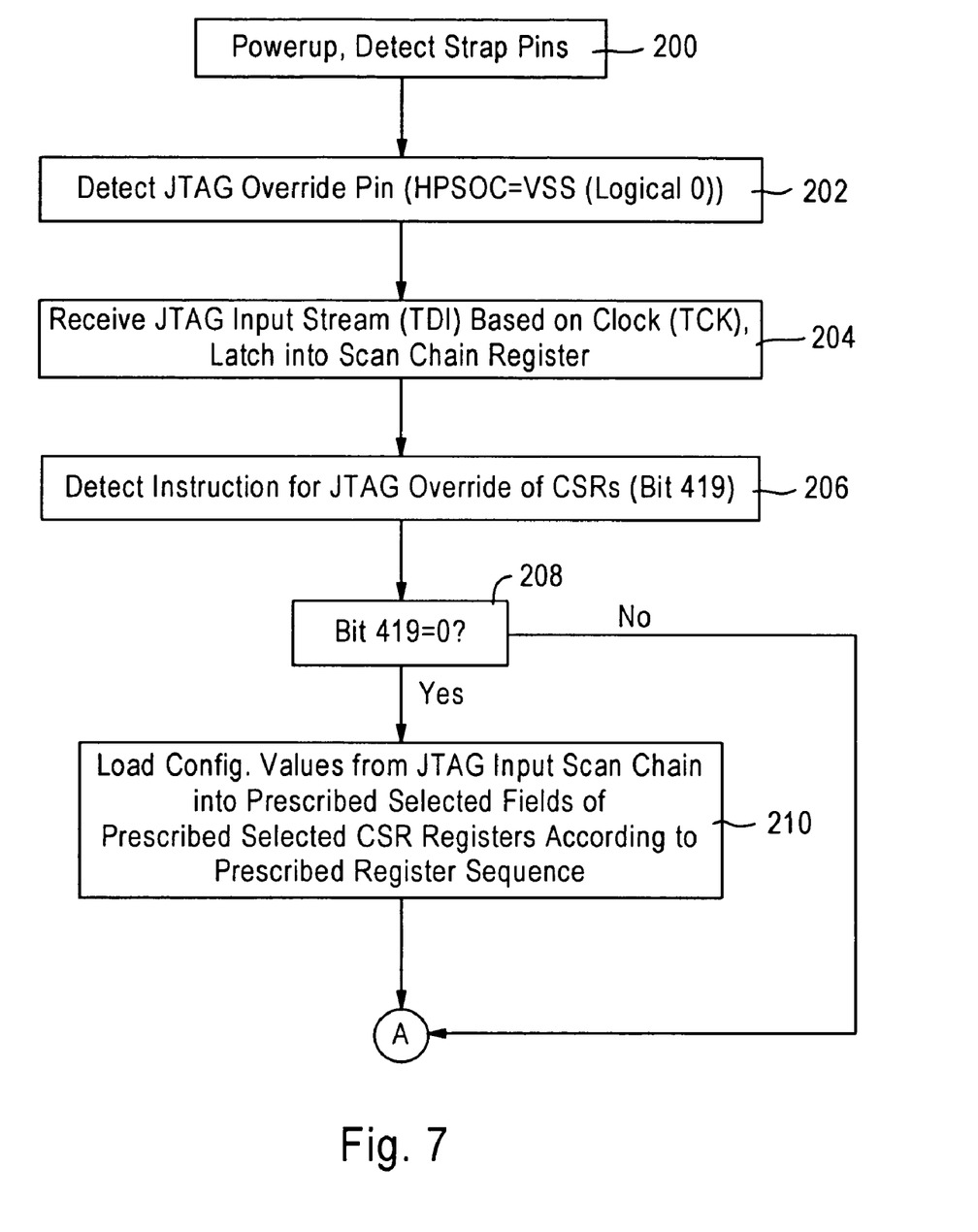
FIG. 7 is a diagram illustrating the method of writing to internal control registers using the JTAG boundary scan chain, according to an embodiment of the present invention.

FIG. 7 is a diagram illustrating the method by the write logic 62 of writing data into selected CSR registers 82 using the JTAG interface 60, according to an embodiment of the present invention. The method begins in step 200, where the write logic 62 detects on power-up any strap pins, including the HPSOC input. If in step 202 that the write logic 62 detects the JTAG override pin is set to logical zero, the write logic 62 writes a received JTAG scan chain into the prescribed registers 82. In particular, the JTAG interface 60 receives in step 204 the JTAG input stream (TDI), and latches in step 204 the input stream into the scan chain register in the serial to parallel converter 74 according the JTAG clock (TCK). The serial to parallel converter 74 of the interface 60, and the write logic 62, detect the instruction bit (bit 419) in step 206.

If in step 208 the write logic 62 and the serial to parallel converter 74 of the interface 60 determine that bit 419 of the JTAG scan chain 80 is set to zero, indicating JTAG override, the write logic 62 loads the configuration values from the JTAG input scan chain 80 into prescribed selected fields (e.g., 90 of FIG. 5) of the prescribed selected CSR registers 82, according to the prescribed register sequence illustrated in FIG. 4. As described above with respect to FIG. 5, each register 82 may have its own corresponding set of register fields 90 at respective locations within the corresponding register 82; moreover, the register fields 90 for a given register 82 may be at non-contiguous locations; hence, the write logic 62 will include mapping information as illustrated in FIGS. 4 and 5 for each and every configuration value (e.g., bits 0-3, bits 4-7, etc.) to be stored in a corresponding register field (e.g., 90a, 90b, etc.).

Figure 8:
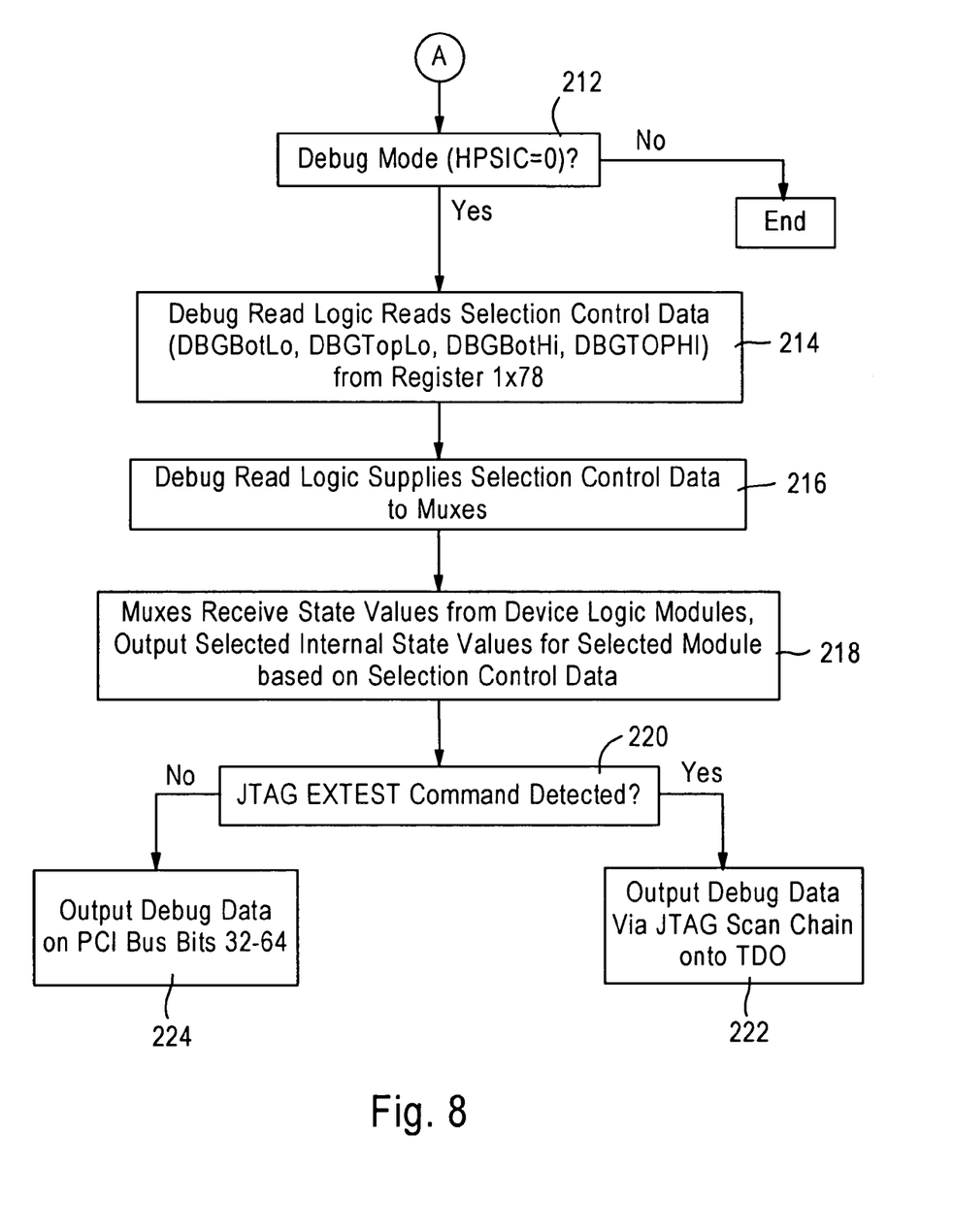
FIG. 8 is a diagram illustrating the method of outputting debug state information to a JTAG boundary scan chain, according to an embodiment of the present invention.

FIG. 8 is a diagram illustrating the method by the debug read logic 64 in outputting debug data onto the JTAG interface 60, according to an embodiment of the present invention. The debug read logic 64 first determines in step 212 whether the device 10 is in debug mode, for example by determining whether the HPSIC pin is asserted to logical zero (VSS).

Based on the debug mode being detected, the debug read logic 64 reads in step 214 the selection control data (DBGBotLo, DBGTopLo, DBGBotHi, DBGTopHi) from the respective register fields 90d, 90e, 90f and 90g in the register 82a. In particular, the selection control data is used to control multiplexers that select the data to be output.

Figure 9:
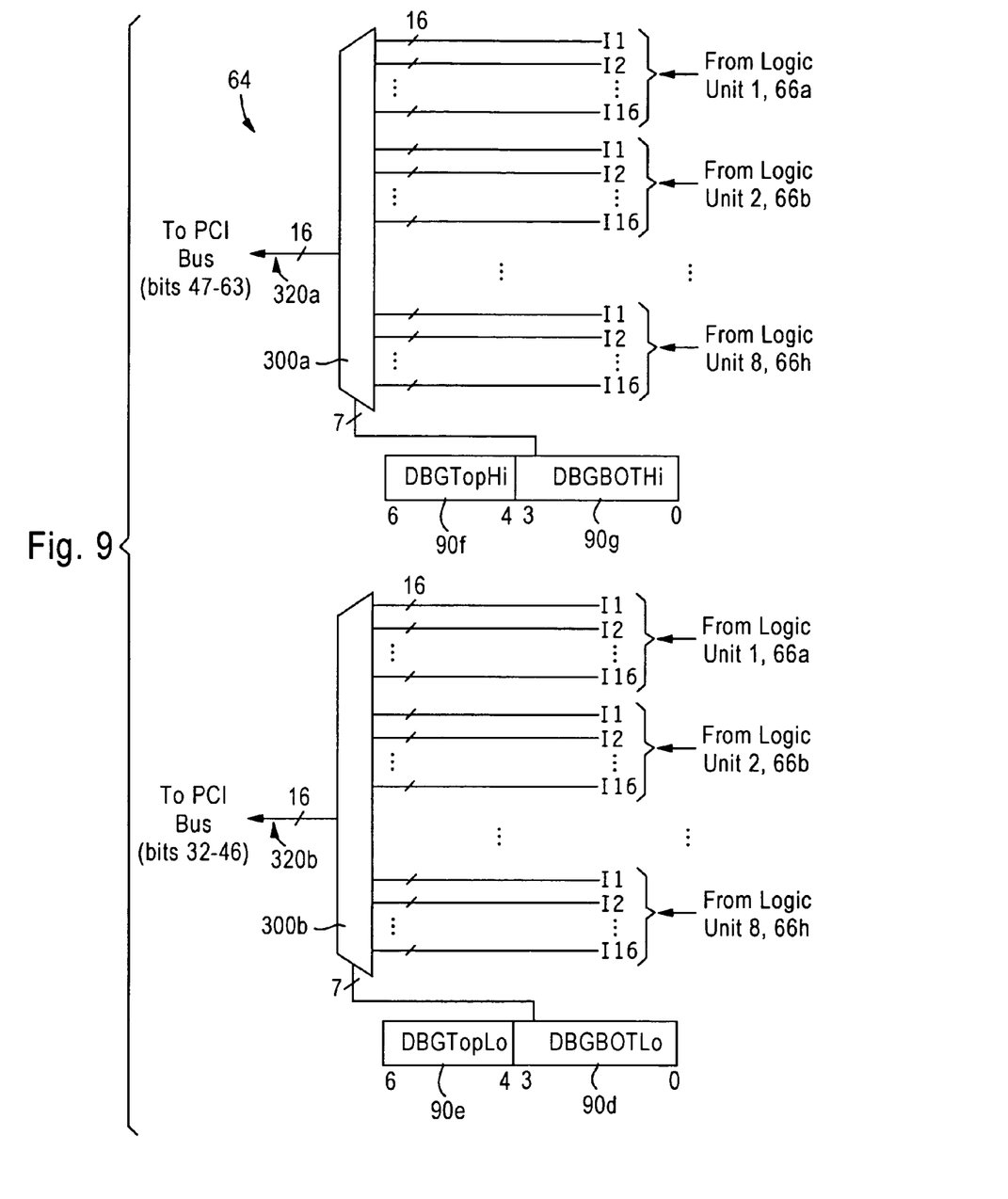
FIG. 9 is a diagram illustrating in detail the write logic of FIG. 3, according to an embodiment of the present invention.

FIG. 9 is a diagram illustrating in further detail the debug read logic 64. As shown in FIG. 9, the debug read logic 64 includes multiplexers 300a and 300b. Each multiplexer 300a and 300b is a 128-to-1 multiplexer configured for receiving one hundred twenty eight (128) 16-bit inputs, and outputting a single 16-bit output: the multiplexer 300a is configured for typically outputting its 16-bit output onto bits 47-63 of the PCI bus 16a, and the multiplexer 300b is configured for typically outputting its 16-bit output onto bits 32-46 of the PCI bus 16a.

The values stored in the register fields 90f and 90g are used to control the multiplexer 300a, and the register fields 90d and 90e are used to control selection inputs for the multiplexer 300b. In particular, each multiplexer 300a and 300b is configured for receiving sixteen 16-bit inputs (I1 through I16) from each of the logic units 66a, 66b, 66c, 66d, 66e, 66f, 66g, and 66h of the logic portion 66. In other words, each logic unit (e.g., 66a) supplies to each multiplexer (e.g., 300a) sixteen inputs (I1, I2, . . . , I16), each input composed of sixteen (16) bits, resulting in a total of 128×16=2048 total bits being supplied to each multiplexer.

Hence, the register field (DBGTopHi) 90g selects the logic unit (e.g., 66a) for multiplexer 300a, and the register field (DBGBotHi) 90f selects the input (e.g., I2) for the corresponding selected logic unit for multiplexer 300a. Similarly, the register field (DBGTopLo) 90e selects the logic unit (e.g., 66b) for multiplexer 300b, and the register field (DBGBotLo) 90d selects the input (e.g., I2) for the corresponding selected logic unit for multiplexer 300b. Consequently, the register fields 90d, 90e, 90f, and 90g can be written by the respective configuration values specified in bits 11-14, 15-17, 18-21, and 22-24 of the portion 80a of the JTAG scan chain 80 to drive the outputs of the debug read logic 64.

Referring to FIG. 8, the debug read logic 64 supplies the selection control data in step 216 from the register fields 90d, 90e, 90f, and 90g to the multiplexers 300a and 300b as illustrated in FIG. 9. The multiplexers 300a and 300b receive in step 218 the state values (I1 through I16) from the device logic modules (e.g., 66a, 66b, etc.), and output in step 218 the selected internal state values 320a and 320b respectively for the selected module based on the selection control data.

Normally the internal state values 320a and 320b would be output onto the upper 32 bits of the PCI bus 16a; however, according to the disclosed embodiment, the debug read logic 64 is configured for redirecting the output values from the multiplexers 300a and 300b to the parallel-to-serial converter 78 based on the JTAG interface 60 detecting in step 220 receipt of a JTAG EXTEST command. Hence, in response to a detected JTAG EXTEST command, the debug read logic 64 redirects the internal state values 320a and 320b from the respective multiplexers 300a and 300b to be output in step 222 via the JTAG scan chain onto the output data path (TDO). However, if the JTAG EXTEST command is not detected, then the debug read logic 64 outputs the debug data 320a and 320b onto the bits 32-64 of the PCI bus 16 in step 224.

According to the disclosed embodiment, internal command and status registers can be overwritten by values scanned into user-defined scan chains and loaded into control registers. Hence, the internal control registers 82 are not implemented as elements on a JTAG user-defined scan chains, but rather the values that are scanned into user-defined scan chains are loaded into the control register elements according to a prescribed sequence under the control of the write logic 62.

In addition, internal state information from internal logic 66 can be selectively scanned out using JTAG EXTEST commands, enabling debug information to be read out of the JTAG boundary scan register. The ability to control the default settings of internal state through a JTAG interface 60 thus saves device pins and thus device cost. The disclosed embodiment also simplifies board design by eliminating special-purpose hardware otherwise needed to control default settings, and simplifies manufacturing and test costs by allowing easier testing of devices. In addition, the ability to read internal state through JTAG scan simplifies debug of devices, and allows debug of problems one attaching a logic analyzer is not practical.

It will be readily apparent that the signal and register names are by way of illustration only, and that various modifications may be implemented consistent with the scope of the claims.

While this invention has been described with what is presently considered to be the most practical preferred embodiment, it is to be understood that the invention is not limited to the disclosed embodiments, but, on the contrary, is intended to cover various modifications and equivalent arrangements included within the spirit and scope of the appended claims.

What is claimed is:

1. A method in an integrated device having a JTAG interface, the method comprising:
    detecting by the integrated device a prescribed device input for a JTAG-based override identifying transfer of configuration values via the JTAG interface, the integrated device further comprising a PCI bus interface, a host interface, and configuration registers storing respective stored configuration values for controlling operations of at least one of the PCI bus interface or the host interface, the host interface configured for providing access by a host device to the configuration registers;
    receiving by the JTAG interface of the integrated device a JTAG clock and a serial input stream according to the JTAG clock;
    detecting within the serial input stream a prescribed instruction for writing of configuration values into respective prescribed selected configuration registers; and
    selectively overwriting, based on detecting the prescribed device input and the prescribed instruction, the respective stored configuration values in the prescribed selected configuration registers of the integrated device with the configuration values from within the serial input stream for modification of the at least one of the operations of the PCI bus interface or the host interface.

2. The method of claim 1, wherein the receiving includes latching the serial input stream according to the JTAG clock, and the selectively writing includes writing each configuration value, following latching a corresponding portion of the serial input stream, into the corresponding prescribed selected configuration register according to an internal device clock.

3. The method of claim 2, wherein the selectively writing further includes forwarding each portion of the serial data stream to a corresponding one of the prescribed selected configuration registers according to a prescribed register sequence.

4. The method of claim 1, further comprising:
    reading a prescribed selected configuration register for debug selection control data;
    supplying the debug selection control data to a multiplexer circuit configured for receiving internal state values having been generated by device logic;
    outputting selected internal state values from the multiplexer circuit according to the debug selection control data to a serial converter; and
    outputting from the serial converter and by the JTAG interface a serial output stream according to the JTAG clock.

5. The method of claim 4, wherein the debug selection control data includes a first portion for selecting one of a plurality of modules within the device logic, and a second portion for selecting the internal state values associated with the selected one of the plurality of modules within the device logic.

6. The method of claim 1, wherein the detecting the prescribed device input includes receiving the prescribed device input for the JTAG-based override via an input to the integrated device that is distinct from the JTAG interface, the PCI bus interface, and the host interface.

7. The method of claim 1, wherein the configuration values include compensation settings for the PCI bus interface, and compensation settings for the host interface.

8. The method of claim 1, wherein the selectively overwriting includes disabling access to the prescribed selected configuration registers via the host interface during the overwriting of the configuration values from the serial input stream.

9. The method of claim 1, wherein the prescribed selected configuration registers store the respective stored configuration values for controlling operations of the PCI bus interface and the host interface, the selectively overwriting including writing the configuration values from within the serial input stream into the prescribed selected configuration registers according to a prescribed register sequence.

10. An integrated device comprising:
    a PCI bus interface;
    configuration registers configured for storing respective configuration values;
    a host interface configured for providing access by a host device to the configuration registers, the stored configuration values controlling operations of at least one of the PCI bus interface or the host interface;
    a JTAG interface configured for receiving a JTAG clock and a serial input stream according to the JTAG clock; and
    write logic configured for detecting within the serial input stream a prescribed instruction for writing of configuration values into respective prescribed selected configuration registers, the write logic configured for selectively overwriting, based on the prescribed instruction and detection of a prescribed device input specifying a JTAG-based override identifying transfer of configuration values via the JTAG interface, selected portions of the serial input stream into the respective prescribed selected configuration registers for modification of the at least one of the operations of the PCI bus interface or the host interface.

11. The device of claim 10, wherein the write logic is configured for writing each configuration value, following latching of the corresponding selected portion of the serial input stream according to the JTAG clock, into the corresponding selected one configuration register according to an internal device clock.

12. The device of claim 11, wherein the write logic is configured for forwarding each portion of the serial data stream to a corresponding one of the prescribed selected configuration registers according to a prescribed register sequence.

13. The device of claim 10, further comprising:
    device logic configured for generating internal state values based on the configuration values;

debug read logic configured for reading a prescribed selected configuration register for debug selection control data, the debug read logic further configured for outputting selected internal state values according to the debug selection control data; and a parallel to serial converter configured for outputting the debug selection control data for output by the JTAG interface as a serial output stream according to the JTAG clock.

14. The device of claim 13, wherein:

the device logic includes a plurality of modules configured for generating respective internal state values, the debug read logic includes a multiplexer circuit configured for receiving each of the internal state values of the respective modules and outputting one of the internal state values based on the debug selection control data;

the debug selection control data including a first portion for selecting one of a plurality of modules within the device logic, and a second portion for selecting the internal state values associated with the selected one of the plurality of modules within the device logic.

15. The device of claim 10, further comprising an external input, distinct from the JTAG interface, the PCI bus interface, and the host interface, for receiving the prescribed device input specifying the JTAG-based override.

16. The device of claim 10, wherein the configuration values include compensation settings for the PCI bus interface, and compensation settings for the host interface.

17. The device of claim 10, wherein the write logic is configured for disabling access to the prescribed selected configuration registers via the host interface during the overwriting of the configuration values from the serial input stream.

18. The device of claim 10, wherein the prescribed selected configuration registers store the respective stored configuration values for controlling operations of the PCI bus interface and the host interface, the write logic configured for writing the configuration values from within the serial input stream into the prescribed selected configuration registers according to a prescribed register sequence.

* * * * *